United States Patent [19]

Sachar et al.

[11] 4,381,818

[45] May 3, 1983

[54] POROUS FILM HEAT TRANSFER

[75] Inventors: Kenneth S. Sachar, Brookline, Mass.; Victor J. Silvestri, Mount Kisco, N.Y.

[73] Assignee: International Business Machines Corporation, Armonk, N.Y.

[21] Appl. No.: 134,243

[22] Filed: Mar. 26, 1980

Related U.S. Application Data

[63] Continuation-in-part of Ser. No. 861,931, Dec. 19, 1977, abandoned.

[51] Int. Cl.³ .............................................. H01L 23/42
[52] U.S. Cl. ..................................... 165/133; 62/527; 165/DIG. 10; 357/82
[58] Field of Search ...................... 165/80 C, 133, 180, 165/DIG. 8, DIG. 10; 62/527; 428/143, 144, 148, 304, 309, 550; 174/15 HP; 357/82; 361/382, 385

[56] References Cited

U.S. PATENT DOCUMENTS

| | | | |
|---|---|---|---|
| 3,587,730 | 6/1971 | Milton | 165/133 |
| 3,598,180 | 8/1971 | Moore, Jr. | 165/133 |
| 3,622,403 | 11/1971 | French | 62/527 |
| 3,706,127 | 12/1972 | Oktay . | |
| 3,739,235 | 6/1973 | Kessler | 165/105 |
| 3,751,295 | 8/1973 | Blumenthal | 165/133 X |
| 3,990,862 | 11/1976 | Dahl et al. | 62/527 |
| 4,064,914 | 12/1977 | Grant | 165/133 |
| 4,120,994 | 10/1978 | Inoue | 165/133 X |
| 4,232,056 | 11/1980 | Grant et al. | 165/DIG. 10 |
| 4,258,783 | 3/1981 | Albertson et al. | 62/527 X |

FOREIGN PATENT DOCUMENTS 804297  11/1958  United Kingdom .............. 165/80 C

OTHER PUBLICATIONS

Cuomo, "Low to High-Temperature Capillary", *IBM Tech. Discl. Bull.* 18, No. 4, 1239-1240, (Sep. 1975).
Thornton et al., "Tubular Hollow Cathode Sputtering Onto Substrates of Complex Shape", *J. Vac. Sci. Technol.* 12, No. 1, 93-97, (Jan./Feb. 1975).
Silvestri, "Forming Porous Aluminum", *IBM Tech. Discl. Bull.*, 19, No. 9, 3622, (Feb. 1977).
Gregor et al., "Porous Silicon Interface to Enhance Heat Transfer from Silicon Substrate to Liquid", *IBM Tech. Discl. Bull.* 19, No. 3, 1120, (Aug. 1976).
Chu et al., "Snap-On Nucleate Boiling Promoter", *IBM Tech. Discl. Bull.* 11, No. 3, 277-278, (Aug. 1968).
Chu et al., "Process for Nucleate Boiling Enhancement", *IBM Tech. Discl. Bull.* 18, No. 7, 2227, (Dec. 1975).
Miersch et al., "Enhancement of Boiling Heat Transfer by a Submerged Capillary Structure", *IBM Tech. Discl. Bull.* 18, No. 11, 3843-3844, (Apr. 1976).
Pearson, "Integrated Circuit Chip Cooling", *IBM Tech. Discl. Bull.* 19, No. 2, 460-461, (Jul. 1976).
Bakelaar et al., "Substrate Mounted Heat Pipe for Chip Cooling", *IBM Tech. Discl. Bull.* 14, No. 9, 2690, (Feb. 1972).

*Primary Examiner*—Sheldon J. Richter
*Attorney, Agent, or Firm*—Graham S. Jones, II

[57] ABSTRACT

A silicon substrate adapted for large scale integrated electronic circuits upon a lower surface has its upper surface coated with a highly porous heat sink film. The film is composed of a porous metal, preferably aluminum, formed by vacuum deposition (evaporation or sputtering) at a high pressure of an inactive gas. The gas can have a pressure of from about 0.5-100 millitorr, and a suitable gas is argon. A porous aluminum film with interconnected nucleation sites which are in the form of reservoir type cavities is manufactured on a silicon surface. The cavities tend to trap vapor of a liquid coolant in contact with the thin film contained in a package enclosing the substrate and its integrated circuit. Cooling fins can be used to cool the coolant.

3 Claims, 15 Drawing Figures

FIG. 1
PRIOR ART
POWER FLUX G v. TEMP. DIFFERENCE

FIG. 4A 2.5 μ meters

FIG. 4B 2.5 μ meters

FIG. 4C 2.5 μ meters

POROUS FILM HEAT TRANSFER

This application is a continuation-in-part of copending U.S. patent application Ser. No. 861,931 filed Dec. 19, 1977, which has been abandoned.

BACKGROUND OF THE INVENTION

1. Field of the Invention

This invention relates to active solid state devices combined with a housing and, more particularly, to fluid cooling for such devices.

2. Description of Prior Art

Boiling: Background

Boiling is one of the heat transfer methods which uses liquids, and it requires the least equipment and expense. In boiling, pockets of vapor at a hot surface to be cooled generate bubbles repeatedly, which, in escaping, agitate the fluid very close to the hot surface. In most forced liquid convection systems it is difficult to cause mixing of hot and cooler liquids on a fine scale next to the hot surface. Cool fluid is brought down to the hot surface, and when it is heated, the fluid is forced upwardly. In rising, the bubbles expand while fluid on the hot surface is evaporated. Initially the process occurs at the hot surface with the evaporation of a thin film of fluid beneath a bubble known as a microlayer. Only a fraction of the heat transferred from the surface is in the form of latent heat within bubbles. The bulk of the heat is carried by liquid convection currents. See G. Leppert, "Boiling," *Advances in Heat Transfer*, Vol. 1, p. 185 (1964).

Figure 1:
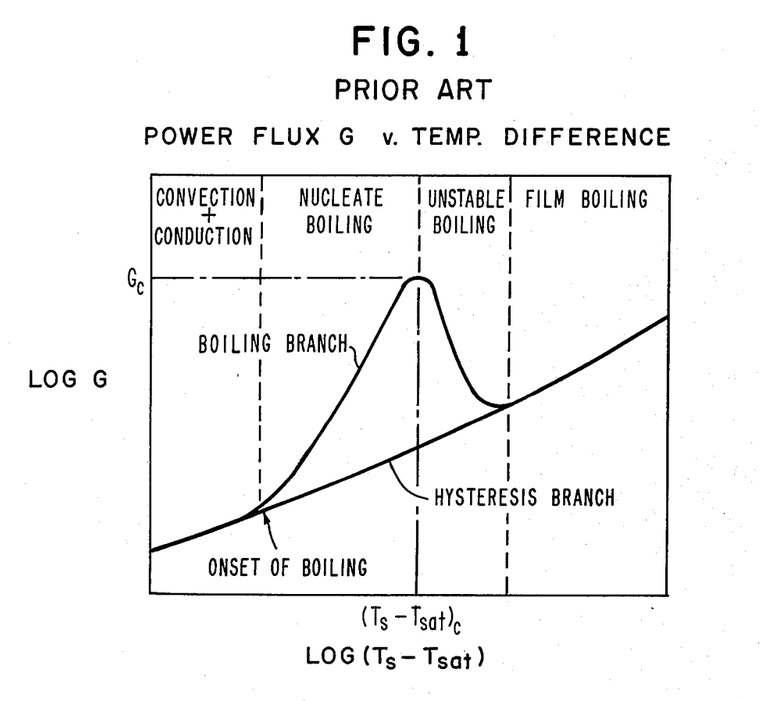
FIG. 1 shows a logarithmic graph of power flux G in units such as watts/sq. in. vs. temperature difference between the temperature $T_s$ of the hot surface to be cooled and the temperature $T_{sat}$ which is the saturation temperature of the cooling fluid employed at the operating pressure.

Performance is usually displayed in a boiling curve such as FIG. 1 which relates the power flux G (watts/-meter$^2$) to the temperature difference $T_s-T_{sat}$. $T_s$ is the surface temperature, and $T_{sat}$ is the saturation temperature of the fluid at the operating pressure (approximately the temperature of the bulk fluid). The improvement in performance which accompanies the onset of boiling is evident. Importantly enough, the system is inherently unstable as shown by the fact that a heat flux slightly greater than the critical flux $G_c$ causes the surface temperature to increase suddenly. Since a new operating temperature for a G greater than $G_c$ is often unacceptably large (beyond the curve of FIG. 1), point $G_c$ is often referred to as "burn-out." Such behavior distinguishes liquid systems from those which rely upon conduction or gas convection (natural or forced). For solid conductors or gases, performance is enhanced as the temperature difference between the hot surface and the ambient medium increases. The systems are always stable. The problem within liquids is associated with bubble formation. As more heat is generated at the surface, bubbles are generated more rapidly and closer together. The escaping bubble streams interfere with each other. Eventually, a point is reached at which the bubbles merge to form a vapor film which holds the liquid in suspension above the surface to be cooled.

Reliability is another limiting feature of boiling systems. To be effective, boiling must occur reproducibly when the heat flux or temperature reaches a certain level. Often this does not occur. The cause is a deficiency of stable nucleation sites (points where bubbles tend to form) on the surface. Since heat transfer within the boiling mode is much more effective than in the natural convection mode, the temperature decreases dramatically once boiling begins. This lagging, hysteretic behavior is particularly unsuitable for systems in which the power level varies. The system may operate at significantly higher temperatures at low power levels than at high ones. The above problems can be alleviated considerably by the use of artificial nucleation surfaces to be described.

Enhancement of Boiling by Surface Treatment:

Effect of Surface Cavities on Boiling

Since the effectiveness of boiling is closely connected with bubble generation, considerable effort has been made by several workers to understand the process. While a bubble 10 in FIG. 2 adheres to a surface to be cooled, some evaporation occurs through a thin annular film of fluid beneath the bubble known as a microlayer 8. See H. H. Jawurek, "Simultaneous Determination of Microlayer Geometry and Bubble Growth in Nucleate Boiling," Int. J. Heat Mass Trans. 12, 843 (1969); R. Mesler, "A Mechanism Supported by Extensive Experimental Evidence to Explain High Heat Fluxes Observed During Nucleate Boiling," AICHE J., 12, 246 (1976); Cooper et al, "The Microlayer in Nucleate Pool Boiling," Int. J. Heat Mass Trans. 12, 895 (1969); Voutsinos et al, "Laser Interferometric Investigation of the Micro-Layer Evaporation Phenomenon," J. Heat Trans. 97, 88 (1975); Foltz et al, "The Measurement of Surface Temperatures with Platinum Films During Nucleate Boiling of Water," AICHE J. 16, 44 (1970). As evaporation occurs, a dry zone 7 of surface 9 is formed within the center of the bubble 10. The heat transfer coefficient of the layer 8 is extremely large. Performance can be improved if microlayer evaporation is extended over larger dimensions or longer times.

Study of the reliable initiation of bubbles with little superheat ($T_s-T_{sat}$) is a more productive line of inquiry. If a bubble is suspended within a liquid, a pressure difference exists between the gas and the liquid.

The excess in pressure is absorbed by the surface tension of the interface. If S is the interfacial surface tension and r is the bubble radius, the difference between the pressure of the vapor in the bubble, $p_v$, and the pressure of the liquid (immediately outside the bubble), $p_l$ is:

$$p_v - p_l = 2S/r \qquad 1$$

If the bubble is in equilibrium, the vapor pocket neither grows nor contracts. In that case, the pressures within the vapor and liquid phases are related by the Clapeyron relation (Cole, "Boiling Nucleation," Advances in Heat Transfer 10, 84, 95 (1974)):

$$p_v - p_l = \rho_v L (T_{be} - T_{sat})/T_{sat} \qquad 2$$

$T_{sat}$ is the temperature associated with a liquid pool of infinite extent in equilibrium with its vapor and subjected to a liquid pressure $p_l$. $T_{be}$ is the average equilibrium temperature of the vapor in the bubble and liquid consistent with that pressure difference (i.e., no growth, no shrinkage). L is the latent heat of the liquid, and $\rho_v$ is the vapor density. If the two equations are combined, the variation of equilibrium bubble temperature with bubble radius is obtained:

$$T_{be} = T_{sat}(1 + 2S/\rho_v L r) \qquad 3$$

If the actual bubble temperature is higher than $T_{be}$, a bubble of radius r grows. If the temperature is lower, the bubble contracts. Eq. 3 establishes the minimum temperature necessary to produce active boiling from a bubble of radius r. Clearly, the larger the initial size of the bubble, the lower the temperature needed to instigate bubble growth and boiling.

Figure 2:
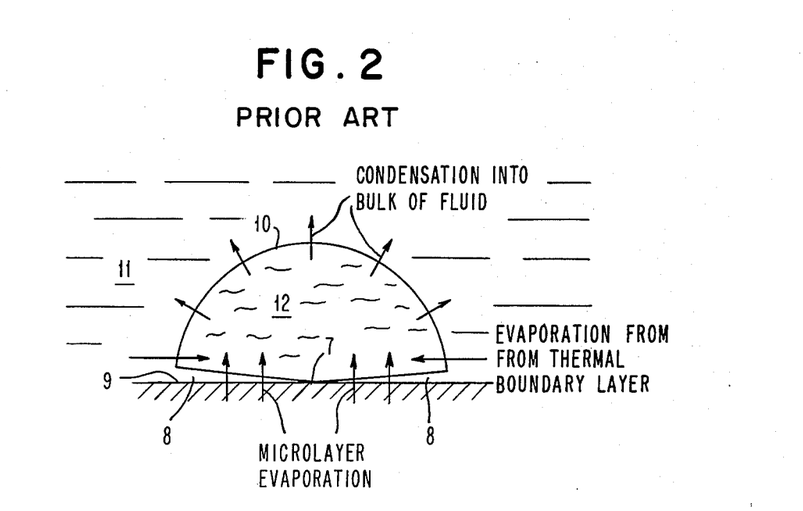
FIG. 2 shows a bubble formed on a flat, hot surface under which remains an annular layer of liquid referred to as a microlayer.

If the heated surface is perfectly smooth, as shown in FIG. 2, initiation of a bubble 10 requires an undesirably large amount of superheat and is as likely to occur within the bulk of the fluid 11 as upon the surface. This reflects the large vapor pressure of a gas 12 confined to such small dimensions. For a surface 14 in FIG. 3A which is not smooth, the situation is dramatically different. If stable vapor pockets or cavities 15 exist in or on the surface, sites for bubble initiation are always available. The larger the pocket or cavity 15, the smaller the amount of superheat necessary to initiate bubble growth. Reliability sets a limit on their size. If the sites are too large, filling by liquid renders them inoperable. Several researchers have concluded that there is an ideal geometry for an active nucleating site—a reservoir cavity (Hsu, "On the size Range of Active Nucleation Cavities on a Heating Surface," J. Heat Trans., 84, 207 (1962); Cole, op cit.). The fluid in contact with the pore wall pulls the liquid-vapor interface upward with a force inversely proportional to the radius of curvature of the interface as in FIG. 3A. If the pore is just a cylindrical cavity 36, (FIG. 3B), once the gas-fluid interface 37 enters, the radius of curvature r is fixed. If the pressure applied by the liquid 33 above is too large, interface 37 descends to the bottom of wall 38 and the cavity 36 is filled with liquid. In the case of a reservoir cavity 15 in FIG. 3A, when the interface 17 reaches the lower lip of the pore 16, interface 17 can pivot around a corner 20. In the process the magnitude of the radius of curvature r decreases before increasing again. In this region interface 17 is stable, since, as the liquid 13 attempts to descend farther into cavity 15, the surface tension produces an increasing force acting to retard the flow. In operation in FIG. 3A cavity 15 in surface 14 of a body to be cooled is initially filled with vapor 19. As the liquid 13 forms more vapor 19, liquid 13 is driven up through pore 16, and a bubble (not shown) escapes, releasing pressure in cavity 15 so interface 17 can project again well within pore 16 to place liquid 13 in contact with walls of pore 16 to produce more vapor 19. This process is far more efficient than that of FIG. 2 because formation of vapor 19 is facilitated by presence of a large liquid vapor interface 17.

Figure 3A:
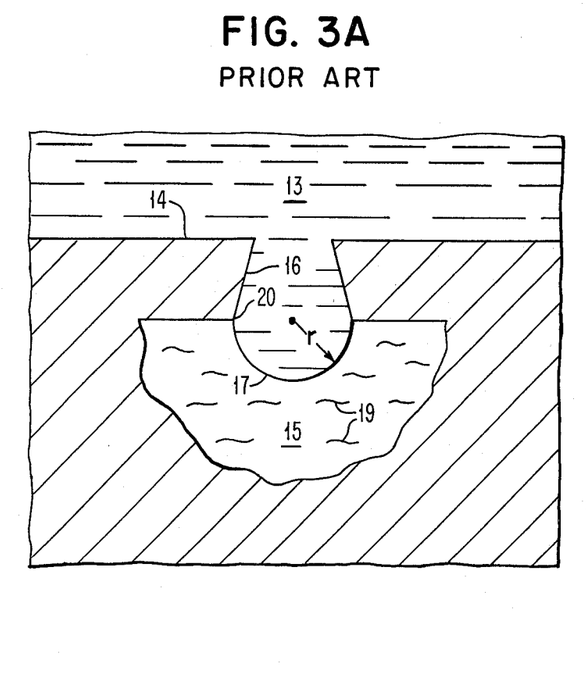
FIG. 3A shows a sectional view of a fragment of a hot surface in which a cavity is formed through which a liquid meniscus extends through a pore into a pocket of vapor.
Figure 3B:
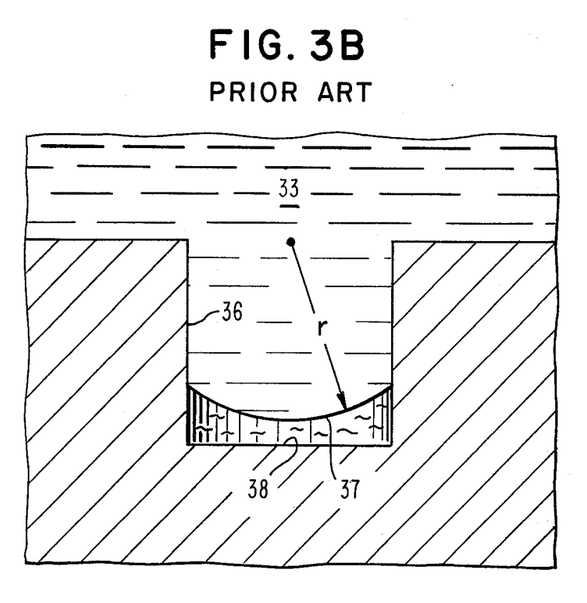
FIG. 3B shows a sectional view similar to that of FIG. 3A for a cylindrical cavity.

As long as the meniscus (interface 17) can support the liquid 13 above it, the cavity 15 stays dry. The site remains active because a macroscopic liquid-vapor interface 17 is always available at which evaporation can occur. We suggest that a rough approximation is sufficient, which is that boiling can be said to occur when the bubble radius predicted by Eq. 3 equals the cavity radius. With that assumption, if the liquid 13 is Freon 113 fluorocarbon, a superheat of 30° C. requires a 0.4 micro-meter cavity; a superheat of 10° C. requires a 1 micro-meter cavity; and a superheat of 1° C. requires an 11 micro-meter cavity.

Alternative Approaches to Surface Conditioning

In the development of a continuously active surface, several approaches are available. The first is to design a cavity shape which can be formed in a surface which is applicable to the particular type of cooling liquid and suface 14 material of the body to be coated and to make such cavities in the surface 14 serve as nucleation sites in FIG. 3A. The effectiveness of the technique depends partially upon correct placement of the cavities 15. If all is done properly, there is evidence that heat transfer can be improved considerably. (Heled et al, "Pool Boiling from Large Arrays of Artificial Nucleation Sites," Int. J. Heat Mass Trans. 8, 1261 (1965)).

A similar technique is to coat a surface with an array of spots. Then a cooling fluid is selected so as to wet the surface, but not the spots. The approach is not to trap vapor but to provide sites at which vapor growth can occur more easily. Again the spacing and size are critical parameters. In addition, surface properties such as contact angle must remain fixed.

Another method uses the observation that a roughened surface exhibits better boiling characteristics than the same surface when smooth. (Bergles, "Recent Developments in Convective Heat Transfer Augmentation," App. Mech. Rev., 26, 675 (1973)). The roughening process apparently creates a spectrum of sites of varying size and activity. At low heat fluxes only the most active sites operate. With increasing flux levels other sites are activated. A process is needed to create active sites preferentially. Surface abrasion with various types of sandpaper has been successful in shifting the boiling curve to lower superheats. (Corty et al, "Surface Variables in Nucleate Boiling," Chem Eng. Prog. Sym. Series 51, 1 (1955)). Coating with a thin layer of low thermal conductivity and heat capacity, a layer of coarse particles, or a layer of porous material all act to increase the critical heat flux $G_c$. (Butler, et al "Improved Pool Boiling Heat Transfer to Helium from Treated Surfaces and its Application to Superconducting Magnets," Int. J. Heat Mass Trans. 13, 105 (1970). Virtually anything which disrupts the uniformity of the surface enhances its heat transfer capabilities. The objective is the creation of more than enough active sites for any occasion. The system selects the appropriate number of sites for proper operation.

The techniques discussed up to this point are passive. Other active methods are known to increase heat transfer. One is film evaporation. Unfortunately, most methods are incompatible with integrated circuits. A frequent suggestion is the application of electric fields in which bubbles are pulled away from the surface electrically, and the onset of film boiling is delayed. However, noticeable effects occur only at extremely high field strenghts in which there is a large probability that the fluid will experience an electrical breakdown.

Surface Treatment—Silicon Chips

Production of Porous Surfaces

Since the subject matter involved herein concerns cooling integrated circuits, treatments must be compatible with silicon device processing. Because of the improvements cited in the literature, interest centers upon porous surfaces for promotion of nucleation of cooling fluids. Performance of a particular technique is compared with that of an etched silicon surface and an etched and polished one. The former corresponds to the backside of an integrated circuit chip, and the latter to the front side on which the device processing is performed. Specific methods of preparation are:

Sandblasting: An abrasive in the form of 27 micrometer aluminum oxide powder is carried within a gas jet in an abrasive unit. Only a few seconds of impingement are needed to roughen the surface. Cooling is enhanced by this process.

Dendritic Coatings: A dendritic tungsten layer can be grown by chemical vapor deposition (J. J. Cuomo, "Low to High-Temperature Capillary," IBM Technical Disclosure Bulletin, 18, 1239, (Sept. 1975), and Cuomo et al, "A New Concept for Solar Energy Thermal Conversion," Appl. Phys. Lett. 26, 557 (1975). The surface is covered by an array of blades approximately 10 micro-meters in height. Chemical vapor deposition requires use of high temperatures, which renders the process inapplicable to treatment of substrates which can be harmed by exposure to high temperatures. The structure has very little porosity and is open so there is very little capability to trap gas. Since gas can escape, efficient boiling is prevented. Bakelaar in "Substrate Mounted Heat Pipe for Chip Cooling," IBM Technical Disclosure Bulletin 14, 2690 (Feb. 1972) describes coating the surfaces of circuit chips solder bonded to a support with a dendritic-type of wicking material, cooled by a dielectric fluid.

Porous Silicon for Cooling: A silicon wafer for a semiconductor device is etched electrolytically when used as an electrode within an electrolytic cell by anodizing in HF (Gregor et al, "Porous Silicon Interface to Enhance Heat Transfer from Silicon Substrate to Liquid," IBM Technical Disclosure Bulletin 19, No. 3, 1120 (Aug. 1976). Variation of the current density and duration of application alters the layer thickness. The size and spacing of the pores depend upon the type of silicon doping (p or n) and the electrical conductivity. In the n-type material used, openings a few micro-meters in diameter taper inward and develop cross-channels. However, this involves use of a wet chemical process which can be hazardous when manufacturing solid-state devices because the chemicals may be exposed to surfaces which should be protected from such wet chemicals.

Porous Films in General: A porous structure not intended for cooling, composed of copper, is produced by sputtering within a 240 micro-meter argon atmosphere at low substrate temperatures. Thornton et al, "Tubular Hollow Cathode Sputtering onto Substrates of Complex Shape," J. Vac. Sci. Technol, 12, No. 1, 93 (1975). Porous aluminum was obtained with evaporation techniques in argon pressure and it was shown that the pressure can be used to change the porosity (Silvestri, "Forming Porous Aluminum," IBM Technical Disclosure Bulletin, Vol. 19, No. 9, p. 3622 Feb. 1977). Miersch and Sachar in "Enhancement of Boiling Heat Transfer by a Submerged Capillary Structure," IBM Technical Disclosure Bulletin, 18 p. 3843 (Apr. 1976) described formation of a surface composed of a porous material, with several layers, the topmost of which has jets evenly spaced apart. The pore size and spacing are important factors. Production of cavities in a surface adapted for heat transfer is achieved in U.S. Pat. No. 4,050,507 to R. C. Chu et al, which shows drilling holes in the back of a wafer with a high energy beam such as a laser to provide nucleate boiling. This subjects the device to an extremely large amount of heat which would destroy many thin film devices.

Channels or Islands: Pearson in "Integrated Circuit Chip Cooling," IBM Technical Disclosure Bulletin, 19, 460-1 (July 1976) describes use of a porous silicon film made porous to remove areas where it is intended to form channels or spaces around islands. All porous material is removed.

Macroscopic Porous Structure: U.S. Pat. No.3,739,235 of Kessler for a "Transcalent Semiconductor Device," describes coating of a chip with metallic layers with many solder-plated copper particles which are bonded together to form a porous capillary structure of a very coarse nature. A fluid such as water saturates the porous structure.

In general, the prior art has taught the desirability of providing porous structures of some kind which should include partially enclosed cavities. However, the techniques used have been deficient in that they did not supply sufficient cooling capacity per unit time and/or they required such high temperatures of fabrication as to risk damage to the sensitive structures. Treatment by scratching a substrate with sandpaper or sandblasting are inadequate because (1) there is a risk of dirt and dust being left on the opposite side of the chip (2) the cooling efficiency of such treatments is relatively poor, largely because no porosity is provided by such superficial treatment. Reactive ion etching to produce holes and laser drilled holes provide no pores communicating between adjacent cavities which is believed by applicants to be essential for proper efficiency of wicking of the cooling film. Dendritic tungsten coatings may provide wicking, but they do not provide cavities for trapping gas, and they require chemical vapor deposition at unacceptably high temperatures for many devices. Wet chemical etcing techniques for producing grooves and the like involve the risk of damage to the chip, operator safety exposure, and chemical disposal problems.

SUMMARY OF THE INVENTION

In accordance with this invention, a thin film solid state device is formed on a substrate. The reverse side of the substrate is coated with a highly porous thin film structure deposited in an evacuated chamber in the presence of a substantial atmosphere of a gas. The thin film structure includes microscopic capillary structures and cavities with transverse interconnection between cavities. A cooling liquid is retained in contact with the porous film.

In another aspect of this invention, the porous film is deposited by a technique of vacuum deposition selected from evaporation and sputtering at substantial pressures of a gas nonreactive with the material being deposited.

In accordance with this invention, a substrate for carrying a thin film solid state device upon a first surface is coated with a vacuum deposited highly porous thin film structure deposited at a relatively low temperature and a relatively high pressure upon the opposite surface of the substrate from the first surface. The structure comprises a film with a plurality of microscopic cavities and capillary structures with a substantial number of transverse interconnections between capillaries.

Preferably, the cooling system includes a substrate having a vacuum deposited highly porous thin film structure upon a cooling surface. A chamber is formed by the substrate and an enclosure for holding a cooling fluid in contact with the porous structure. The porous structure comprises a porous thin film deposited in a vacuum chamber in the presence of a gas nonreactive with the components of the structure.

It is preferred that the thin film structure comprise a thin film of aluminum which is vacuum deposited at a relatively low temperature in a relatively high pressure of an inert gas. The pressure should be greater than about 0.5 millitorr. It is desirable that the thickness of the film structure be at least as great as the film pore size, providing for substantial trapping of gas in microscopic pores. Further in accordance with the invention, the porous thin film structure comprises aluminum deposited in an argon pressure between about 0.5 millitorr and 100 millitorr.

It is preferred that the porous thin film structure comprise aluminum deposited by sputtering in an argon atmosphere at a pressure of between about 0.5 millitorr and 100 millitorr. It is alternatively preferred that the porous thin film structure comprise aluminum deposited by evaporation in an argon atmosphere at a pressure of between about 0.5 millitorr and 100 millitorr.

DESCRIPTION OF THE PREFERRED EMBODIMENT

As can be seen from the above discussion, covering a heated surface with a liquid which boils at a desired operating temperature is desirable. Preferably, the surface should not be smooth unless an acceptable temperature is significantly higher than the temperature at which boiling initiates. Use of a smooth surface can result in overheating and destruction of an integrated circuit formed on a chip when a circuit is turned on or when the amount of power dissipated changes very significantly. Furthermore, once boiling commences, heat flux G introduced to the fluid must be kept below $G_c$, the critical value, so film boiling will not occur, when bubbles are generated so rapidly that they coalesce across the entire hot surface before leaving the surface. Such boiling vapor films separate the liquid from the surface so that the vapor film forms an insulating layer leading to rapid increase of the temperature of the hot surface to unacceptably high temperatures.

Artificial nucleation sites have been provided by numerous techniques to improve the rate of formation of bubbles and to overcome such problems as film boiling.

Figure 4A:
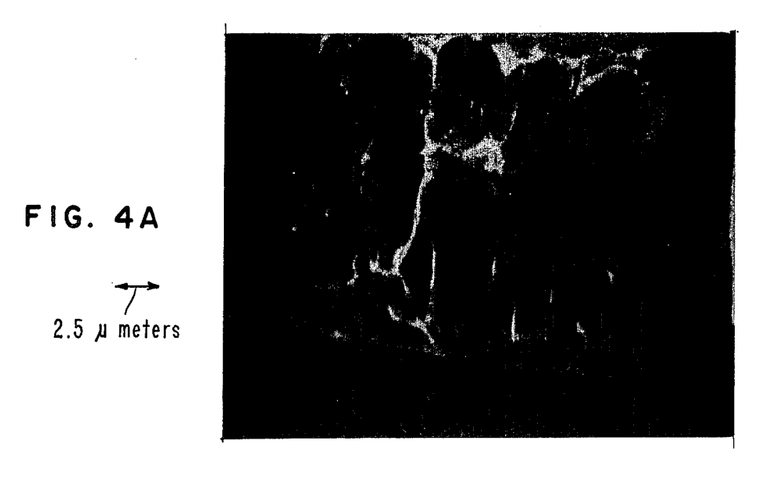
FIG. 4A shows a photograph of a vertical cross-section of an aluminum film sputtered under a high pressure of argon.
Figure 4B:
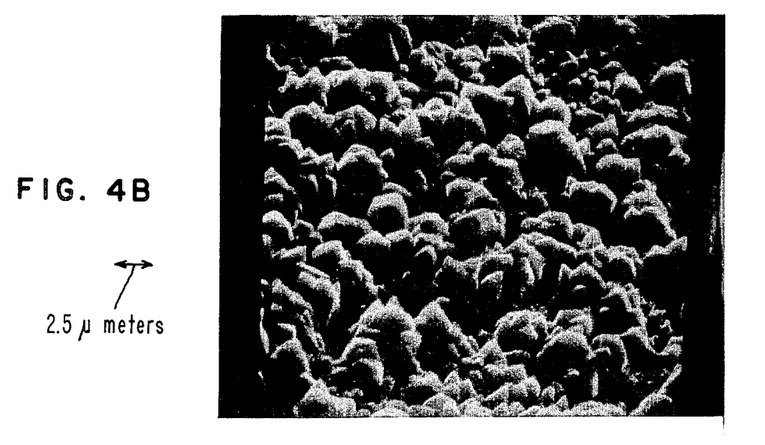
FIG. 4B shows a photographic perspective view of the upper surface of the film of FIG. 4A.
Figure 4C:
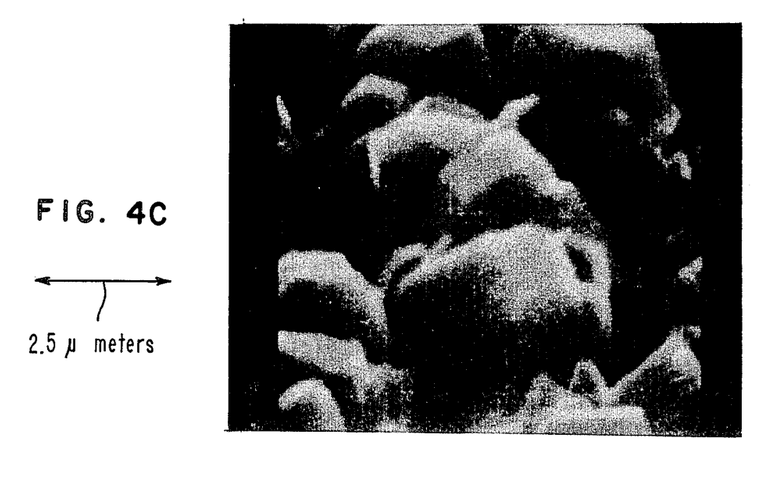
FIG. 4C shows an enlarged view of a fragment of the photographic view of FIG. 4B.

FIG. 4A shows a photograph of an SEM image of a vertical section of a new thin film of porous aluminum about 15$\mu$ meters thick made by sputtering aluminum at a pressure of 20 millitorr of argon onto a chip. The section is through a cleaved portion of the film and is shown magnified 4000 times at an angle of 90 degrees. FIG. 4B shows the same sputtered aluminum film in a perspective view from above at an angle of 45 degrees, magnified 3000 times. FIG. 4C is a similar view to FIG. 4B magnified 12,000 times. FIG. 4A shows surprising structures with substantial transverse interconnection, substantial cavities capable of trapping vapor and the like, with openings provided at the top for escape of vapor and entrance of liquid during reciprocation of the liquid interface in active boiling. It can be seen by reference to FIG. 8 that this film cools 15 watts stably at 60° C. for a 15$\mu$ meter thick film.

The porosity consists of vertical pores with many interconnecting channels making the films useful as both a source for initiating nucleate boiling and as a wick when employed as a heat pipe material. In this case, capillary action of the porous Al draws fluid from the periphery onto the heated area where evaporation occurs. The mechanical attachment of a nonintegrable wick structure has been cited in the literature as a severe limitation in the implementation of heat pipes mounted directly on chips. By making the wicking material (i.e., porous aluminum) an integral part of the structure, this difficulty is avoided.

The closely spaced vertical columns of metal (aluminum in this case) can be varied in height, width and spatial density as a function of the deposition rate and the pressure of the gas (argon in this case). By adjustment of the above parameters, myriads of cavities of the sort shown in FIG. 4A can be formed. This type of structure greatly increases the value of the critical heat $G_c$.

Figure 5A:
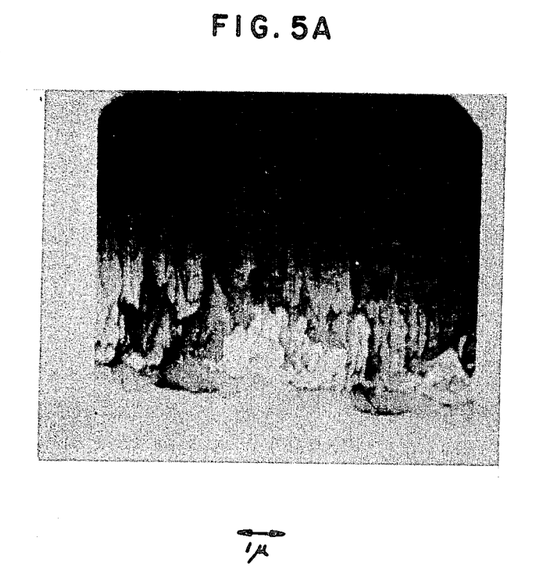
FIG. 5A shows a photograph of a vertical cross-section of an aluminum film evaporated under a high pressure of argon.
Figure 5B:
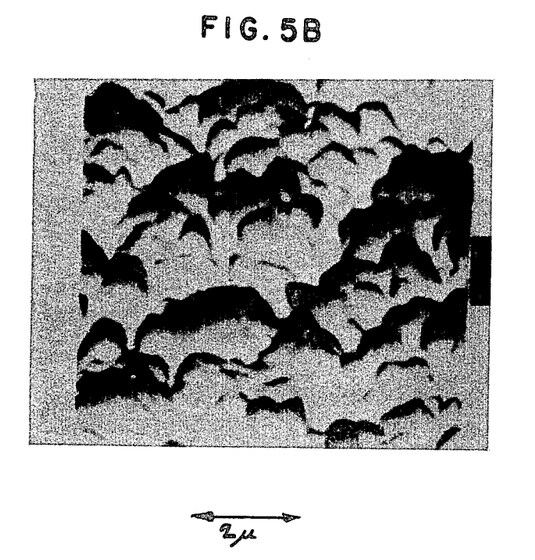
FIG. 5B shows a photograph of a perspective view of the upper surface of the film of FIG. 5A.

FIGS. 5A and 5B show SEM photographs of an evaporated thin film structure about 4 micro-meters thick. FIG. 5A shows a vertical section. The film is generally similar in appearance to FIG. 4A for a thin film of aluminum deposited upon a substrate by means of evaporation of the aluminum in a vacuum chamber containing an atmosphere of 6 millitorr of argon gas. FIG. 5B shows a 45° SEM photograph of the upper surface of the evaporated film. The effectiveness of this film as a cooling material is illustrated in FIG. 7B, curve 7, where it has an excellent characteristic, cooling at 10 watts stably at 60° C.

Figure 6:
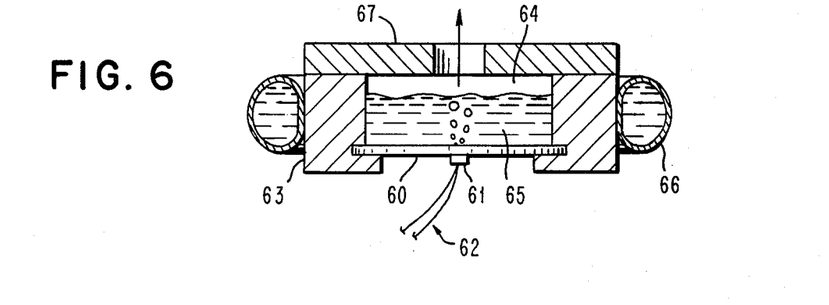
FIG. 6 shows a test apparatus for measuring the effectiveness of a cooling film on a substrate.

FIG. 6 shows apparatus useful for measuring the effectiveness of cooling of a given thin film layer applied to an n-type silicon wafer 60 which can be 3.2 cm. in diameter with 10 ohm-cm. resistivity. A heating strip 61 is evaporated onto the bottom side of the wafer 60, where an integrated circuit would have been deposited if the wafer were used as a part of an integrated circuit system. Strip 61 is composed of chromium (500 Å) and platinum (2000 Å). The metal film 61 which acts as a heater is originally 0.32 cm. by 1.9 cm. However, once the electrical terminals are attached to the ends, the thin film length is reduced to 1.3 cm. A chromel-alumel thermocouple 62 monitors the temperature at the center of the strip 61. The tip is coated with an epoxy to render it electrically insulating and is then mechanically attached to the heater. The wafer is clamped to a water-cooled copper ring 63, and the chamber 64 is filled with Freon 113 fluorcarbon coolant 65. The current and the voltage are continuously monitored. Ring 63 is cooled by cooling coil 66. A cover 67 is provided with an opening through which vapor from coolant 65 can leave chamber 64.

When the polished side of a wafer is exposed to Freon 113 fluorocarbon, boiling begins when strip 61 reaches 100° C. When the critical flux $G_c$ is reached, 4 watts are dissipated into the fluid directly over the strip 61. When a wafer coated with porous aluminum is used, boiling begins when strip 61 reaches 60° C. In this case, the critical flux $G_c$ corresponds to a power dissipation of 9 watts.

Two separate tests are conducted for each surface: one with the cell dry and the other with the cell filled with fluid 65. To calculate the power actually carried away by the fluid 65 at a certain film temperature, the input power to a dry cell which results in that temperature is subtracted from the input power to the wet cell. Until the surface begins to boil, the curves which relate power to temperature are almost coincident. The implication is that in the absence of boiling almost all of the heat flows through the wafer 60 to wall 63. The little heat which is injected into the liquid is the result of natural convection. The strength of convection is largest directly over the heater. When boiling does occur, the surface pattern of the bubbles conforms to the outline of the heater. Heat flows either into liquid 65 directly above heater 61 or through the wafer 60 to wall 63. The heat flux associated with a surface temperature is calculated by dividing the above difference by the area of the heater, 0.39 cm.$^2$.

Variation of Heat Transfer with Surface Preparation

Figure 7A:
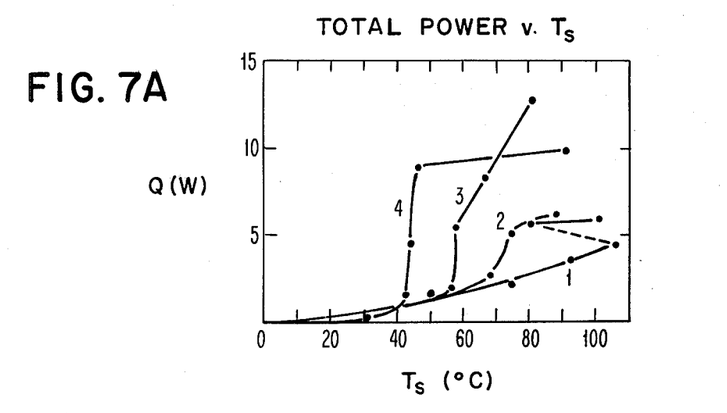
FIGS. 7A and 7B show curves of heat injection into a coolant versus surface temperature of the surface to be cooled.
Figure 7B:
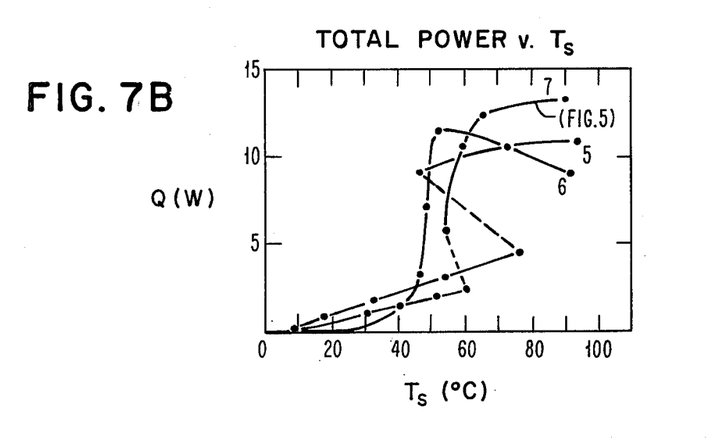

A summary of the results of some experiments on surface roughening is provided in FIGS. 7A and 7B, which show the measured heat injection into Freon 113 flurocarbon as a function of surface temperature for several silicon surface treatments: (curve 1) polished and etched Si; (curve 2) polished Si; (curve 3) porous n−Si (4 micro-meters thick); (curve 4) porous n−Si (100 micro-meters thick) in FIG. 7A; and (curve 5) dendritic tungsten; (curve 6) sandblasting (27 micro-meter abrasive); (curve 7) porous aluminum deposited at a pressure of 6 millitorr as stated in connection with FIGS. 5A and 5B and 4 micro-meters thick shown in FIG. 7B.

All methods lower the surface temperature required to initiate boiling of Freon 113 flurocarbon (Tbp=47.3° C.) and raise the critical heat flux beyond that of polished silicon. The data indicate that the power injected into the fluid remains relatively constant at sufficiently large temperatures. However, FIG. 1 predicts that the surface temperature increases dramatically when the heat flux exceeds $G_c$. The difference results from the parallel thermal path through the silicon. Since the thermal resistance in the film boiling mode is much larger than the value for the conduction path through the wafer, heat in excess of Gc is channeled through the silicon. The system remains at the upper limit of the nucleate boiling range. For a sufficiently large amount of dissipation, conduction can no longer cope with the excess power at a temperature less than $T_c$. Beyond this point the system passes into film boiling. The value of G in the plateau region corresponds to $G_c$ for the system.

Use of the data to indicate hysteresis should also be discussed. Conventionally, a system is claimed to exhibit hysteresis when, in the process of increasing and then decreasing the heat flux, the temperature proceeds along different paths. All of the power is assumed to be injected into the liquid. In the experiment, two parallel paths exist for the heat, one into the liquid and the other through the wafer. At low power levels, the thermal resistance of the path through the wafer is less than that of the path into the fluid. At high power levels, the reverse is true. In the experimental system, when hysteresis is displayed in the form of considerable superheat followed by a sudden transition to boiling, not only does the temperature suddenly decrease, but the flux of heat into the fluid increases. The situation resembles a chip mounted on a substrate by solder pad bonds. The solder pads provide parallel paths for the heat flow other than through the back of the silicon chip.

Porous aluminum is the most attractive surface conditioner with respect to lowering the temperature at which boiling begins, increasing $G_c$, and minimizing hysteretic behavior. The process is dry, can be performed at low temperatures, and is delicate enough to be considered for chip processing. The degree of improvement in boiling characteristics is impressive. From FIGS. 7A and 7B, curve 1 and curve 7 show that the wafer temperature at boiling initiation decreases from over 100° C. to less than 60° C. The heat flux increases from 15 watts/cm.$^2$ to 32 watts/cm.$^2$. Hysteresis diminishes to less than 5° C.

Deposition of the porous film can be at room temperature and is by conventional processes (evaporation and sputtering). In the case where an elevated temperature is allowed, the process can be performed at an intermediate stage of the device fabrication with little effect upon either the previous or subsequent stages.

Depositions of porous Al form mechanically sturdy films in intimate contact with the Si substrate or chip.

Engineering capability: Experiments have shown that porosity can be varied with proper choice of argon pressures and films can be grown over a wide range of thicknesses. (Films up to 10$\mu$ micro-meters have been grown).

The film can be deposited in a batch fabrication step under clean conditions and at low temperatures, both of which are critical in insuring device reliability and reproducibility. The effects on device characteristics of depositing aluminum are known to be harmless. Thus, a large amount of retesting to determine the effects can be eliminated. The data base already exists.

In heat transfer studies, identical silicon wafers processed with porous Al allow approximately 3 times the power (18 watts) to be dissipated from the same area (1/16 sq. in.) into Freon 113 fluorocarbon as from polished silicon (conventional backside treatment). There is a significant decrease in the amount of superheat (temperature of surface in excess of saturation temperature of fluid at operating pressure) necessary to initiate boiling and in extent of hysteresis (difference in temperature at a given power level when boiling is and is not occurring) to a few degrees. In both respects, porous Al compares favorably or significantly exceeds results of other treatments (sandblasting, porous Si, tungsten).

Porous films were applied in a sputtering chamber as explained in connection with Examples I-III below in a glow discharge sputtering system of the type described in U.S. Pat. No. 3,616,450 of Clark entitled "Sputtering Apparatus." The system had the trade name Sloan Sputtergun Model S-310 manufactured by Sloan Technology Corporation, 535 East Montecito Street, Santa Barbara, California 93103. It is described in the Installation and Operating Instructions manual distributed by that company dated February 1974 bearing the identification M-617-274.

In each of Examples I-III below, the system was operated without coating the substrates in a mode known as presputtering with the substrates in place below a shutter. First, the system is pumped down to a low base pressure. A plasma of argon is initiated after the system is backfilled with argon gas. The sputtered material from the cylindrical target strikes the shutter, principally, during that time. In each case, presputtering continued for 30 minutes as argon gas was pumped through the system at the pressure indicated for the purpose of assuring removal of impurities from the system.

EXAMPLE I

|  | Presputtering | Sputtering |
| --- | --- | --- |
| Base Pressure (millitorr) | $4.0 \times 10^{-7}$ | — |
| Carrier Gas | Argon | Argon |
| Operating Pressure (millitorr) | 8 | 8 |
| Cathode Incident Power (watts) | 450 | 450 |
| Cathode Current (amperes) | 1.1 | 1.15 |
| Cathode Voltage (volts) | 420 | 400 |
| Deposition Time (minutes) | 30 | 265 |
| Thickness ($\mu$ meters) | 0 | 11 |
| Rate (Å/minute) | 0 | 415 |
| Mode |  | Fixed Position |

EXAMPLE II

|  | Presputtering | Sputtering |
| --- | --- | --- |
| Base Pressure (millitorr) | $6.1 \times 10^{-7}$ | — |
| Carrier Gas | Argon | Argon |
| Operating Pressure (millitorr) | 20 | 20 |
| Cathode Incident Power (watts) | 450 | 450 |
| Cathode Current (amperes) | 1.5 | 1.5 |
| Cathode Voltage (volts) | 320 | 320 |
| Deposition Time (minutes) | 30 | 250 |
| Thickness ($\mu$ meters) | 0 | 10 |
| Rate (Å/minute) | 0 | 400 |
| Mode |  | Fixed Position |

EXAMPLE III

|  | Presputtering | Sputtering |
| --- | --- | --- |
| Base Pressure (millitorr) | $6.6 \times 10^{-7}$ | — |
| Carrier Gas | Argon | Argon |
| Operating Pressure (millitorr) | 28 | 30 |
| Cathode Incident Power (watts) | 450 | 450 |
| Cathode Current (amperes) | 1.7 | 1.7 |
| Cathode Voltage (volts) | 290 | 290 |
| Deposition Time (minutes) | 30 | 250 |
| Thickness ($\mu$ meters) |  | 9.24 |
| Rate (Å/minute) |  | 369 |
| Mode |  | Fixed Position |

Figure 8:
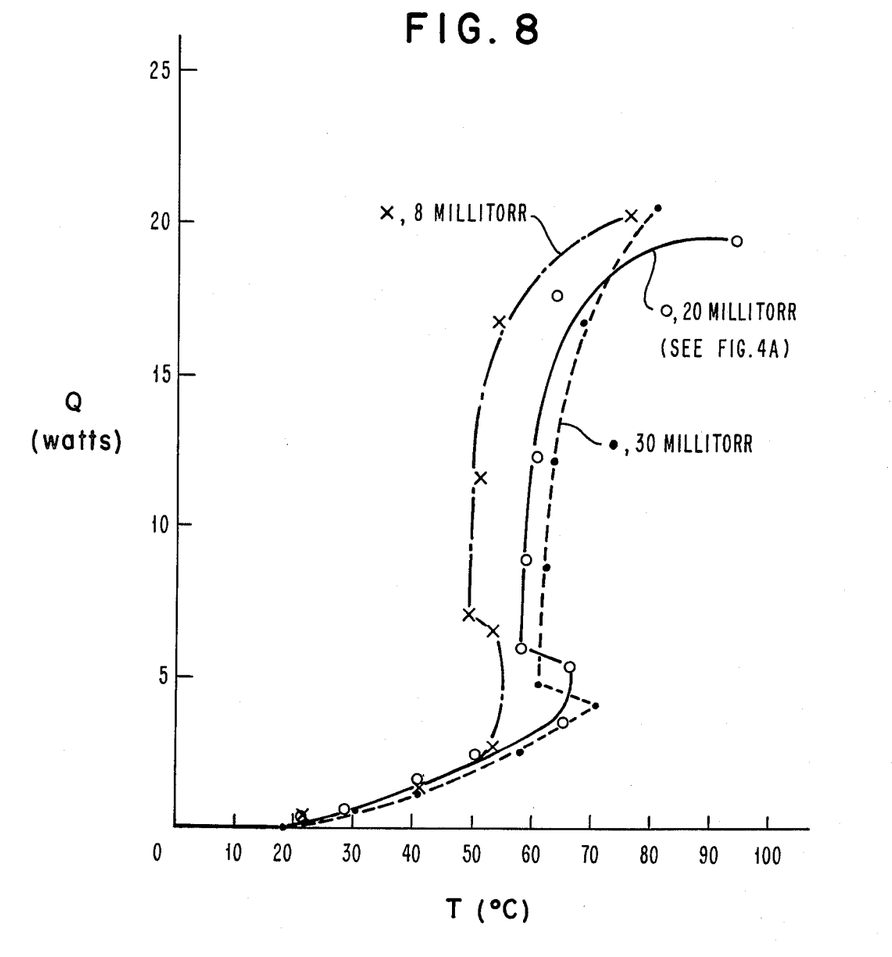
FIG. 8 shows a curve of heat injection into a coolant from three aluminum films sputtered in three different pressures of argon, as a function of surface temperature of the substrate coated with the aluminum surface.

FIG. 8 shows the power Q in watts dissipated vs. temperature for films deposited by sputtering in argon gas at 8 millitorr (11 $\mu$m thick), 20 millitorr (10 $\mu$m thick), and 30 millitorr (9.24 $\mu$m thick). It can be seen that in all cases the 8 millitorr film boils at a lower temperature, has less hysteresis associated with it, and allows more power to be dissipated at a given temperature. The 8 millitorr film was also 10% thicker and deposition time was 6% longer.

The peak power levels are considerably greater than those obtained for the previously evaporated aluminum film (21 watts for an 8 millitorr film after 2 hr. immersion vs. 13 watts before).

Evaporation in Argon Gas

A standard vacuum thin film evaporation system having an oil diffusion pump was employed for depositing porous aluminum in argon gas also. The system was pumped down to $10^{-3}$ millitorr. Argon was then bled into the system with a leak valve. Continual pumping was employed to maintain a constant argon pressure from 0.1-20 millitorr. A Ta boat rested below a rotatable holder carrying substrates in recesses therein. The holder was suspended from the top of the system. Pellets ($\frac{1}{4}''$) were placed in the Ta boat and a current of 260-280 amperes was applied. Porous aluminum was deposited both with and without rotation. The deposition rate was a function of the distance between the boat and the substrates as well as argon pressure under which the evaporation took place. Growth rates on Si achieved for a $7\frac{1}{2}$-8" distance were as shown in runs A-D:

| Run | Pressure Millitorr of Argon | Thickness Å | Time Minutes | Rate Å/min. |
| --- | --- | --- | --- | --- |
| A | 0.1 | 18,000 | 6 | 3000 |
| B | 0.3 | 16,000 | 8.42 | 1900 |
| C | 0.5 | 13,000 | 4.65 | 2795.7 |
| D | 1.0 | 8,500 | 7.17 | 1185.5 |
| E | 6 | 5,100 | 4 | 1275 |
| F | 6 | 12,000 | 8 | 1500 |
| G | 6 | 3,000 | 2 | 1500 |
| H | 2 | 7,000 | 8 | 875 |
| I | 6 | 11,000 | 8 | 1375 |

Runs E, F, and G and I exemplify the rates achieved in experiments for a 6 millitorr pressure such as that employed for FIGS. 5A and 5B.

Figure 10:
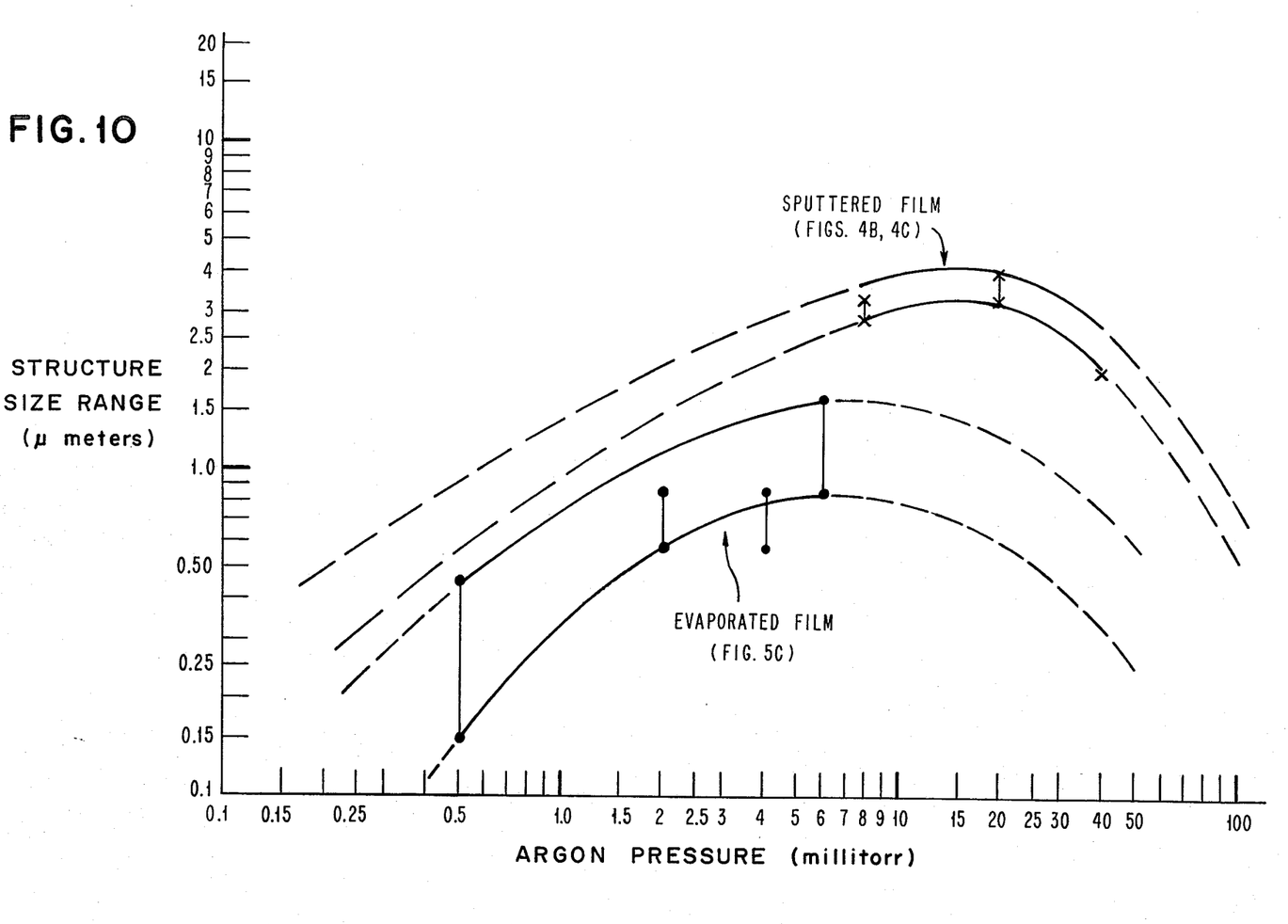
FIG. 10 shows the range of size of structures produced by evaporating and sputtering aluminum films as measured from photographs such as FIGS. 4B, 4C, and 5B.

For evaporated and sputtered films made as above, surface photographs taken of the porous films at 45° in an SEM show that the structure which creates pores can be varied as a function of argon pressure. The range of maximum and minimum structure sizes is shown in FIG. 10. The structure size is defined as the width (lateral dimension) of a single structure, pillar or column seen in FIGS. 4A and 5A. In sputtered films, the structure size was generally larger and the pressure used was generally higher. A range from a fraction of a millitorr to about 100 millitorr provides a maximum range of structure size.

In the evaporation system, the growth rate of films dropped markedly as the distance between the aluminum source and the substrate increased for a given pressure. This was probably because of aluminum-argon atom collisions preventing line-of-sight deposition.

Figure 9:
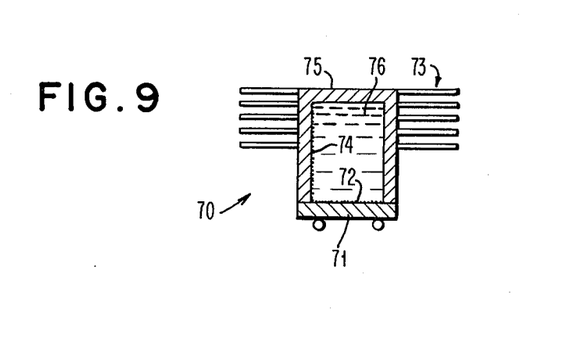
FIG. 9 shows a miniature heat pipe adapted to operate to cool a cooling surface with a fluid coolant contained in the heat pipe.

FIG. 9 shows a miniature heat pipe 70 with a silicon chip 71 coated with porous aluminum 72 deposited on the top surface of chip 71. Aluminum 72 is saturated with a working fluid such as a fluorocarbon coolant. A secondary wick of porous aluminum 74 is formed on the inner surface of a housing 75 containing the coolant 76. Fins 73 are provided for cooling housing 75.

It has been observed from photographs taken in connection with this invention such as FIGS. 4A, 4B, 4C, 5A, and 5B that for any given pore size, which can be seen in FIGS. 4A and 5A respectively, the structure size shown in FIGS. 4B and 4C on the one hand and FIG. 5B on the other hand respectively, the pore size is roughly proportional to the structure size. For example, a maximum structure size indicates that the film beneath will have a maximum pore size.

The fact that a pore size is large in lateral dimension (width) is an important factor in successful cooling as is clarified above. However, thinner films with large pore size will tend to be more open, as in FIG. 3B and thus, while large pore size is a necessary condition, alone it is not sufficient because the thickness of the film must be at least as great in dimension as the pore size in order to hold gas in the pores and to prevent the pores from filling up. However, when the pore size is very large, there is an increasing probability that the pores will fill with cooling liquid. On the other hand, if the pores do not fill up with cooling liquid, enhanced cooling occurs.

It has been found that thicker films yield improved cooling results because they do not fill up with liquid so easily. The films which were evaporated as in FIGS. 5A and 5B were thinner than those of FIGS. 4A, 4B, and 4C, and as can be seen, the cooling provided in FIG. 8, which corresponds to the 15$\mu$ meters thick film of FIGS. 4A and 4B is superior to the 4$\mu$ meters thick film of FIGS. 5A, 5B, and 5C as shown by curve 7 in FIG. 7B.

At higher pressures, the structures become smaller again under the pressure exerted by the gas atoms pressing down upon the deposited film to a greater extent, thus producing a smoother film.

The porous cavities in accordance with this invention are less than about five micro-meters in diameter and at the upper level of the coating, the cavities ae relatively open in that the walls do not converge and are substantially vertical although they are twisted and curved in configuration. Furthermore, the film is a vacuum deposit. In addition, the deposit is composed of a metal, preferably aluminum as taught above. The thickness of the films is greater than or equal to the diameter of the cavities. As can be seen in FIGS. 4A-4C, the pores are substantially uniformly distributed over the surface of the film, and the cavity structures are convoluted in shape and nature.

Experimental Results

FIG. 8 shows that a set of sputtered cooling films provides a Q of 20 watts of cooling at about 70° C. for films deposited by sputtering at three different pressures. Referring to FIGS. 7A and 7B, porous silicon etched films and porous aluminum films (curve 7, FIGS. 5A and 5B) which are evaporated produced Q values no larger than 15 watts at any temperature up to 100° C. Thus, the results obtained in accordance with this invention are clearly superior to any prior art reference. The curves in FIG. 10 clarify the relationship between sputtered and evaporated films in accordance with this invention. The structures are better defined for cooling in accordance with this invention because of the 5 micro-meter pore size. The fact is that these structures are superior in cooling capacity to the prior art according to laboratory tests. The films are also quite substantially different in structure from the prior art as defined in the claims.

Further Description of Prior Art

The Gregor et al publication describes a film which is disadvantageous as pointed out above. The disadvantage of the Gregor et al film is that it is manufactured by a wet chemical electrolytic process with an etching acid which can be hazardous when manufacturing solid state electrical and electronic devices because the chemicals may be exposed to surfaces which must be protected from such wet chemicals.

The use of thin porous films for the purpose of cooling of electronic circuits has been taught for several years. The art is a crowded one in which one reference does not suggest another one. Such references are included for the purpose of showing the number of such references.

Dahl et al U.S. Pat. No. 3,990,862 is a reference which is not in the art of electronic and electrical devices. Dahl et al teaches providing a porous aluminum and aluminum oxide coating upon the surface of a heat exchanger with pores which are larger than 7.6 micrometers which produces a cooling capacity only one-eighth of that of the current state of the art as exemplified by this invention. This would tend to lead one away from the use of such materials as porous aluminum.

"Substrate Mounted Heat Pipe for Chip Cooling," Bakelaar, IBM Technical Disclosure Bulletin, 14, No. 9 2690 (Feb. 1972) describes dendritic capillary cooling of the surface of a number of chips mounted in a heat pipe by nucleate boiling. The dendritic wicking material is stated to improve the cooling capacity of the heat pipe. The dentritic material is deposited upon the backs of the chips.

In an abstract by Oktay et al, "Preparation and Performance of Dentritic Heat Sinks," Extended Abstracts Spring Meeting, the Electrochemical Society, May 12-17, 1974 Abstract No. 81, 203-204 (1974), the dendrites are magnetic material which is applied to the back of the chips by placing the pole of a magnet beneath the surface of a chip. Then electroless plating is employed to hold the magnetic brushlike particles in place. See attached U.S. Pat. No. 3,706,127 also.

Cuomo, "Low to High-Temperature Capillary," IBM Technical Disclosure Bulletin 18, No. 4, 1239-1240 (Sept. 1975) describes the formation of tungsten dendrites upon the surface of several different materials for use on a heat pipe as a wicking material for cooling liquid such as fluorocarbons.

Chu et al, "Snap-on Nucleate Boiling Promoter," IBM Technical Disclosure Bulletin 11, No. 3, 277-278 (Aug. 1968) describes use of porous TEFLON (polytetrafluorethylene) sleeves 18a which promote nucleate boiling through pores to cool studs 14 in which high power components 12 are housed. A liquid coolant is employed. Note that this arrangement was used in 1968.

Chu et al, "Process for Nucleate Boiling Enhancement," IBM Technical Disclosure Bulletin 18, No. 7, 2227 (Dec. 1975) describes etching bubble sites in the back side of a semiconductor chip. The bubble nucleation sites are manufactured by covering the back of the chip with photoresist which is then exposed and developed to open a number of sites, and then the back of the chip which may be glassed is etched through the glass and the silicon of the chip to provide undercutting and formation of doubly reentrant cavities.

As will be recalled, the Kessler U.S. Pat. No. 3,739,235 describes use of solder-plated particles in film 82 (83 which is a portion of 82) Col. 4, line 23 et seq. It should be noted that the Kessler patent was filed in 1972 and issued in 1973. The Thornton article was published in 1975, and FIG. 4 indicates by footnote on its legend that it was published in reference 6 in that reference which was published in 1974.

In summary then, it seems clear that the idea of using porous metal films made by means of vacuum coating at higher than usual pressures is not obvious in view of the Gregor et al reference which is related to etching and anodization to form a thin porous film with a wet process. Nothing in the prior art suggests that there is a reason for concluding that the variety of porous film produced by Gregor et al teaches a similar structure can be obtained in any form of vacuum deposition process, and more especially a high pressure vacuum deposition process.

Further in accordance with this invention, a substrate is provided for carrying a thin film electrical device upon a first surface thereof. It includes a silicon sheet with an electrical device upon said first surface. A vacuum deposited, highly porous, vertically extending, columnar, thin film cooling structure is deposited upon the opposite surface of said sheet. The porous, columnar structure comprises an unoxidized, metallic, thin film, vacuum deposit with a plurality of substantially uniformly distributed, partially enclosed, vertically extending, vapor trapping, microscopic cavities having a diameter on the order of about five micro-meters and less with convoluted, substantially vertically extending, nonconverging walls and openings at the upper surface on the order of one micro-meter in diameter and capillary structures with a substantial number of transverse interconnections between the cavities and adjacent cores of the cavities. The thickness of the film is at least as great as the diameter of the cavities, thereby providing for substantial trapping of vapor in microscopic pores.

What is claimed is:

1. A substrate for carrying a thin film electrical device upon a first surface thereof, comprising
   a silicon sheet with an electrical device upon said first surface,
   a sputtered, highly porous, vertically extending, columnar, thin film cooling structure deposited upon the opposite surface of said sheet of from about 9 micro-meters to about 15 micro-meters,
   said porous, columnar structure comprising an unoxidized, metallic, thin film, deposit with a plurality of substantially uniformly distributed, partially enclosed, vertically extending, vapor trapping, microscopic cavities having a diameter of about one to five micro-meters with convoluted, substantially vertically extending, nonconverging walls and openings at the upper surface on the order of one micro-meter in diameter and capillary structures with a substantial number of transverse interconnections between said cavities and adjacent ones of said cavities, and the thickness of said film being at least as great as the diameter of said cavities, thereby providing for substantial trapping of vapor in microscopic pores.

2. A cooling system for a chip carrying an electrical device including
   a substrate comprising a silicon chip having a sputtered, metallic aluminum, vertically extending, columnar, highly porous structure upon a cooling surface thereof of from about 9 to about 15 micro-meters in thickness,
   a thin film electrical device upon the opposite surface thereof,
   a cooling liquid comprising a fluorocarbon,
   a chamber formed by said substrate and an enclosure holding said cooling fluid in contact with said porous structure,
   said highly porous structure comprising an unoxidized metallic aluminum, thin film deposit with a plurality of substantially uniformly distributed, partially enclosed, vertically extending, vapor trapping, microscopic cavities having a diameter of about five micro-meters with convoluted, substantially vertically extending, nonconverging walls and openings at the upper surface on the order of one micro-meter in diameter and transverse capillary structures interconnecting said cavities, and the thickness of said film structure is at least as great as the diameter of said cavities, thereby providing for substantial trapping of vapor in microscopic pores.

3. A substrate in accordance with claim 1 or 2 wherein said film structure comprises a thin film of aluminum vacuum deposited at a relatively low temperature in a pressure of about 8 to 30 millitorr of an inert gas.

* * * * *